US006177833B1

(12) United States Patent
Gabric et al.

(10) Patent No.: US 6,177,833 B1
(45) Date of Patent: Jan. 23, 2001

(54) INTEGRATED CIRCUIT MODULE HAVING REDUCED IMPEDANCE AND METHOD OF PROVIDING THE SAME

(75) Inventors: John A. Gabric, Essex Junction; Michael A. Roberge, Milton; Endre P. Thoma, Colchester, all of VT (US)

(73) Assignee: International Business Machine Corp., Armonk, NY (US)

( * ) Notice: Under 35 U.S.C. 154(b), the term of this patent shall be extended for 0 days.

(21) Appl. No.: 09/303,293

(22) Filed: Apr. 30, 1999

(51) Int. Cl.[7] .......... H01L 25/00

(52) U.S. Cl. .......... 327/565; 327/564

(58) Field of Search .......... 326/82, 83, 84, 326/85, 86, 87; 327/108, 109, 110, 112, 564, 565

(56) References Cited

U.S. PATENT DOCUMENTS

| | | | |
|---|---|---|---|
| 5,311,081 | 5/1994 | Donaldson et al. | 320/62.21 |
| 5,444,311 * | 8/1995 | Imai et al. | 327/565 |
| 5,508,906 | 4/1996 | Nelli et al. | 363/97 |
| 5,568,081 | 10/1996 | Lui et al. | 327/380 |
| 5,675,298 | 10/1997 | Bhagwan et al. | 333/1 |

* cited by examiner

*Primary Examiner*—Timothy P. Callahan
*Assistant Examiner*—An T. Luu
(74) *Attorney, Agent, or Firm*—Thornton & Thornton; David R. Thornton; Robert A. Walsh

(57) ABSTRACT

An integrated semiconductor module of reduced impedance and method utilizing a given chip architecture of the type having a memory circuit and a plurality of off-chip drivers and their I/O pads, the module being constructed in a configuration for operation of said memory circuit with less than the number of available drivers such that there are a number of excess drivers and output pads not used for driver operations, and one or more of these excess drivers and their pads are connected to the power terminals of the chip to provide one or more power paths through these drivers and their associated pads in parallel with the power paths of the operational drivers, and the method includes connecting the excess drivers and their output pads to the power terminals of the chip during its fabrication in a manner to provide additional power paths.

13 Claims, 3 Drawing Sheets

INTEGRATED CIRCUIT MODULE HAVING REDUCED IMPEDANCE AND METHOD OF PROVIDING THE SAME

FIELD OF THE INVENTION

This invention relates to integrated circuit modules, and more particularly to integrated circuit modules having reduced impedance and a method for providing such modules.

BACKGROUND OF THE INVENTION

Requirements of modern computers increasingly burden the design of their memory modules due to increased output driver current and expected voltage slew rate.

During operation of the computer as each required circuit switches on, an output current is applied to its respective I/O pin or pad and, in turn, this current must flow from the driver power supply associated with the circuit being turned on. Consequently, where a large number of drivers switch simultaneously or at high frequency, a DC or AC shift in supply potential can occur which degrades the noise margins on the chip. This becomes more significant as power supply voltages decrease. Hence it is of importance to decrease the impedance of circuit modules.

In a paper entitled "Ground Bounce Control in CMOS Circuits" appearing in the "1988 IEEE International Solid State Circuits Conference Transactions", the problem of ground noise or bounce, due to the variation of the chip ground relative to the external ground, was discussed together with a proposed solution. This solution required having a control voltage source, tailored to the process creating the circuit, be created to regulate the charge/discharge rate of a series transistor in the output buffer and thereby equalize the delay, speed, rise/fall time and ground bounce of the CMOS output buffers thus requiring the faster element be slowed down. Further, this proposed solution is process dependent and cannot, for a number of practical purposes, be used in production.

U.S. Pat. No. 5,317,206 is directed to an attempt to stabilize voltage bounce within a circuit and does this by adding delay elements to the circuit. These delay elements, arranged to decrease the rising speed of the voltage at the circuit output, reduce the voltage noise but do so by sacrificing circuit speed.

Similarly U.S. Pat. No. 5,315,172 adds a pair of transistors serially connected between the voltage supply and ground with their common terminal connected to the circuit output so that, when either one of this serially connected pair is turned on, a slower rate of charge or discharge of the output occurs. This reduces the time rate of change of current through the circuit inductance and thereby reduces the voltage noise or bounce but again does do by sacrificing circuit speed.

U.S. Pat. No. 5,568,081 teaches the use of a variable slew rate control circuit for automatically adjusting the rate at which a node is driven to a voltage once again by sacrificing circuit speed.

As a practical solution, the semiconductor industry will only accept circuit changes that can be easily and inexpensively produced without sacrificing circuit speed or significantly impacting other circuit performance criteria. The present invention overcomes the above described problems without requiring additional circuit elements that impact circuit performance or speed.

SUMMARY OF THE INVENTION

A circuit module of reduced impedance, and a method for providing the same, utilizes an integrated circuit module having a chip architecture providing a given circuit, such as a memory circuit and a plurality of off-chip drivers such that, when the module is configured for operation with less than the total number available drivers, some drivers and their output pads are in excess, and in accordance with the invention, at least one of the excess drivers and its associated output pad are connected to the power terminals to provide at least one additional power voltage path in parallel with the power paths in the operational drivers to thereby reduce module impedance.

The method includes connecting one or more of its excess drivers and their output pads to the power terminals for conduction through at least portions of these drivers thereby providing additional power paths in parallel with the previously existing power paths in the module. Hence, this reduction in module impedance is achieved by forcing excess drivers and their output pads to operate as additional power paths in parallel to the usual power paths in the chip.

In the preferred embodiment, substantially all of the excess drivers and their output pads are utilized to provide impedance lowering, additional power paths. Moreover, one half of the excess drivers and their output pads are preferably connected across the power terminals of the chip for conduction in a first direction whereas the other half are connected to the power terminals to provide conduction in the opposite direction.

Accordingly, it is an object of the present invention to provide a circuit module having reduced impedance.

It is another object of the invention to provide a circuit module having added power paths to thereby reduce module impedance.

It is a further object of the invention to provide a method of making a module having reduced impedance by enhancement of a present chip design to economically add power paths in the chip during fabrication.

It is a still further object of the invention to utilize excess output pads in a given semiconductor chip to facilitate the provision of additional power paths therein.

These and other objects and features of the present invention will become further apparent from the following description taken in conjunction with the drawings.

DESCRIPTION OF THE PREFERRED EMBODIMENTS

Figure 1:
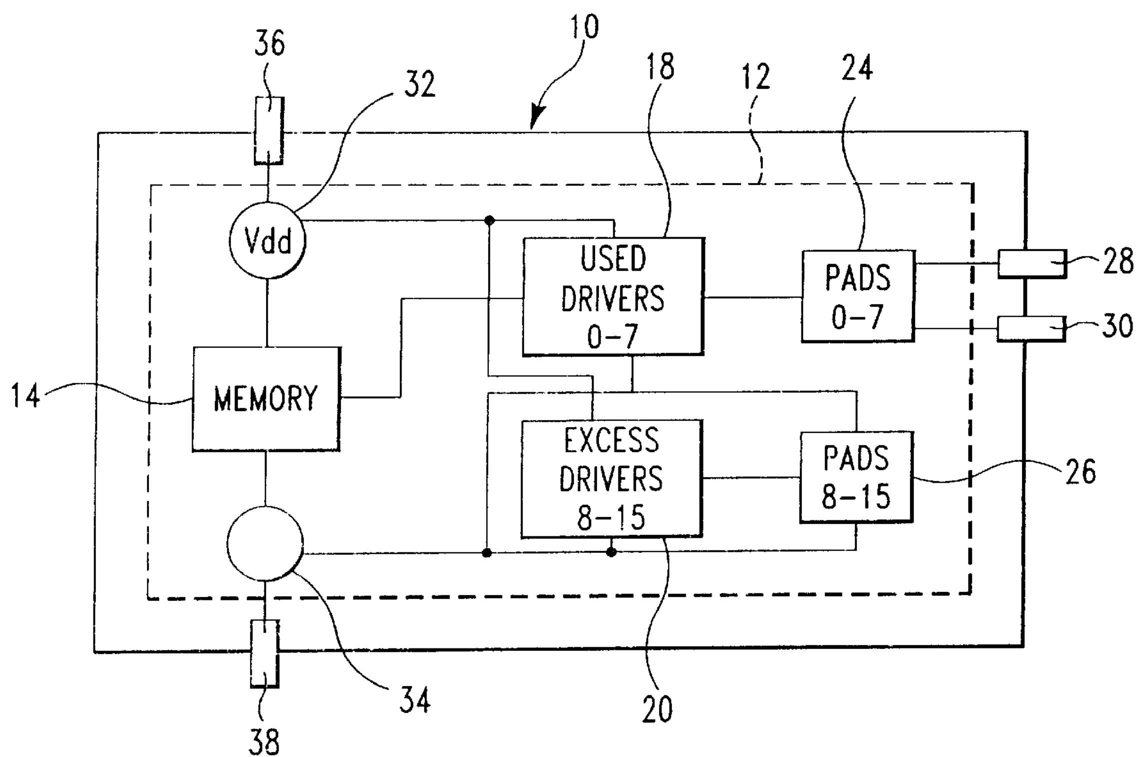
FIG. 1 is a diagrammatic plan view, partially in block diagram form, illustrating a circuit module constructed in accordance with a first embodiment of the invention.

In FIG. 1, a semiconductor module 10 is diagrammatically illustrated, partially in block diagram form, as including an integrated chip 12 (shown in dotted outline). The chip 12 is fabricated in a chip architecture of the type providing a memory circuit 14 and a plurality of off-chip drivers and associated I/O pads, or output pads, for facilitating the transfer of data signals off chip in a conventional manner.

The chip 12 is basically designed for systems utilizing a plurality of off-chip drivers for simultaneous delivery of data signals from the chip.

During fabrication, a given chip is often enhanced in a well known manner to provide different unique implementations. That is, a sixteen bit module may be altered during fabrication to provide eight or four bit modules in accordance with customer requirements. Hence, although the same basic chip is utilized for the latter modules, many of the available drivers are simply inactive in the prior art.

Figure 2:
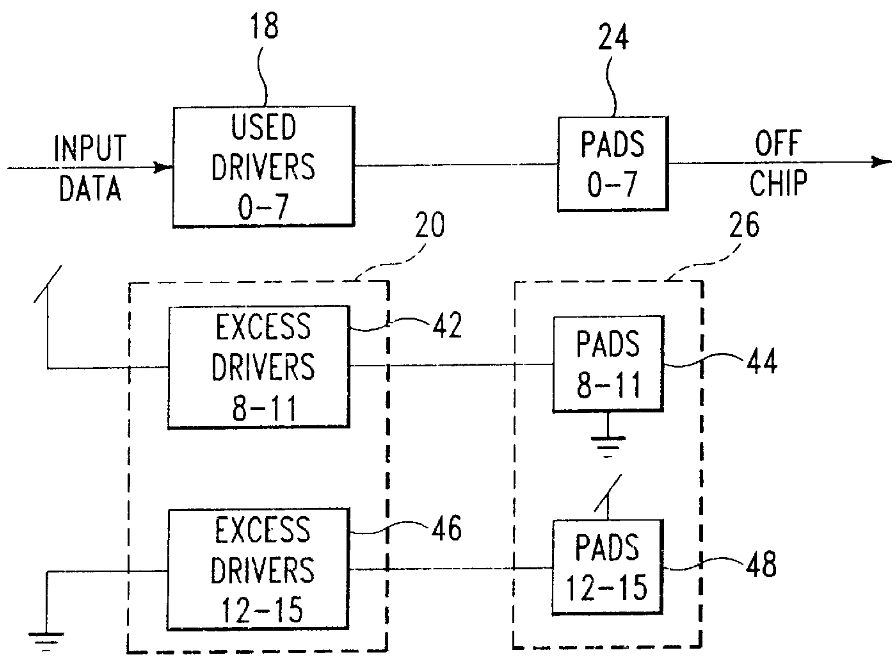
FIG. 2 is a block diagram illustrating the driver arrangement of FIG. 1 in more detail.
Figure 3:
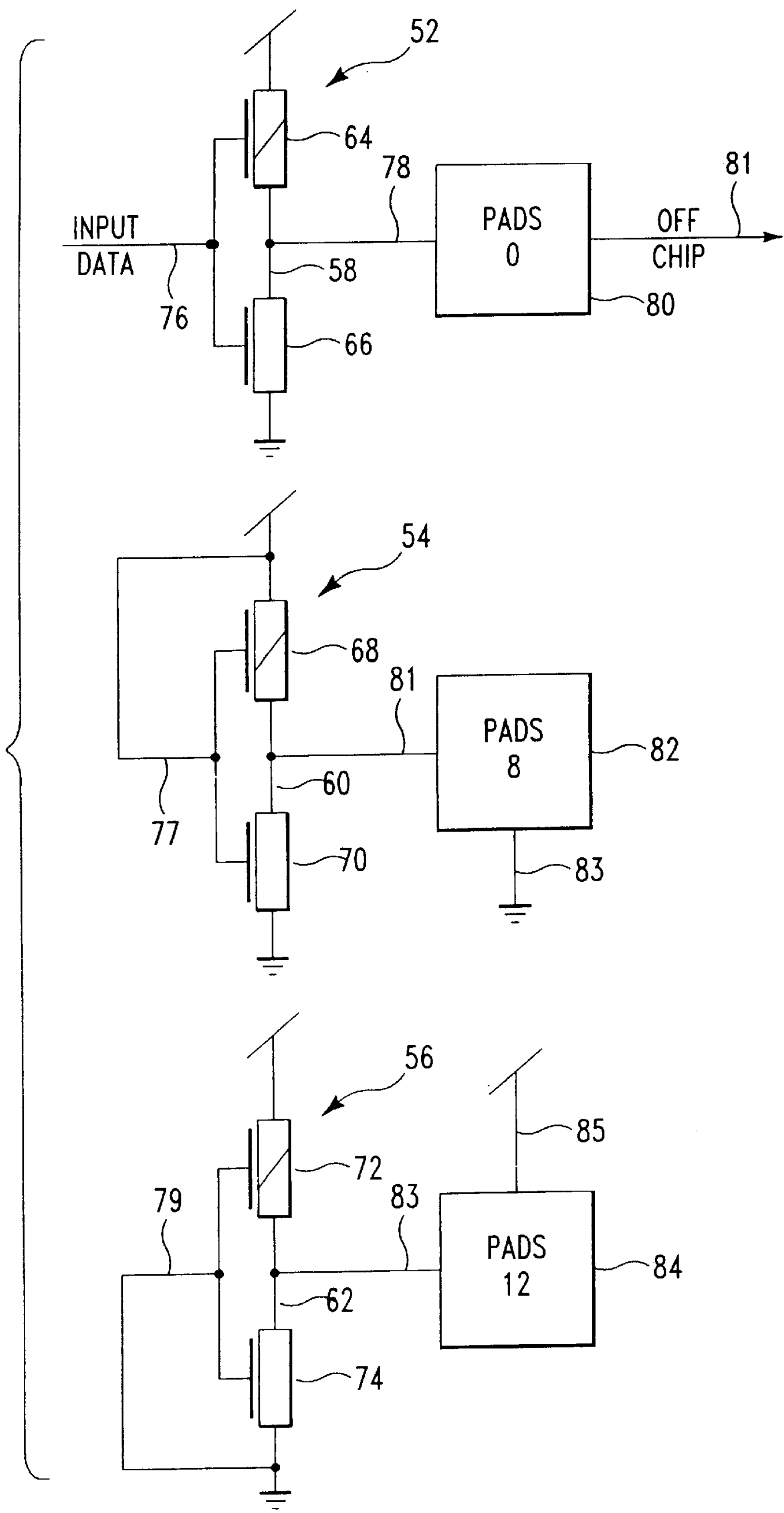
FIG. 3 is a circuit diagram illustrating the three different circuit arrangements typical of the driver circuits of FIGS. 1 and 2.

Turning now to the first embodiment illustrated in FIGS. 1–3, wherein the chip 12, while fabricated in a sixteen bit architecture having sixteen off-chip drivers, is configured for utilization in a computer system requiring only an eight bit output. Hence, as depicted in FIG. 1, only eight of the drivers 18 and their associated eight pads 24 are arranged to be active for off-chip driver operations, and the remaining eight drivers 20 and their pads 26 are not used for driver operations such that they are excess. In this figure, the active drivers are designated in block 18 as used drivers 0–7 whereas the excess drivers are designated in block 20 as excess drivers 8–15. Consequently, in the prior art, the eight excess drivers 20 and their pads 26 are not wired out, but rather are normally disabled.

In the eight bit module, the chip 12 is provided in a conventional manner with an additional address so that the logic portion of the memory circuit 14 can select, in order, each half of the memory to thereby allow operation as only an eight bit module. Typically, the eight bit part has an added column address provided during chip fabrication.

In the inventive construction, however, these excess drivers 20 and their pads 26 are connected across the power voltage terminals 32, 34 to provide the noted additional power paths. As to be expected, the eight output pads 24, associated with the used drivers 18, are employed for delivery of data signals off chip. Hence, the output pads designated in block 24 as PADS 0–7, are respectively wired out to eight of the module leads, only two of which are shown herein at 28 and 30.

The remaining eight excess drivers 20 and their output pads 26 are utilized as additional power voltage paths to reduce module impedance. That is, the excess drivers 20 and their excess pads 26 are connected to a pair of power voltage terminals 32 and 34 in a manner to provide additional power paths in the module 10. These power terminals 32, 34 are, in turn, coupled to a pair of module leads 36 and 38 in a conventional manner for powering of the chip 12.

In this regard, the power voltage terminal 32 is intended for connection herein to the high voltage side, represented as Vdd, of the power supply voltage (not shown). and the terminal 34 is intended for connection to the low voltage side, represented as ground.

Consequently, in the method of the invention, one or more of the excess drivers 20, or portions thereof, and their pads 24 are connected across the power terminals 32, 34 in a manner to provide additional power paths in parallel with those of the used drivers 18. Preferably, all the excess drivers 20 are utilized for additional power paths. Moreover as subsequently described in more detail, in order to provide impedance balance in the module 10, one half of the excess drivers and their pads are preferably arranged for conduction in one direction, and the other half and their pads arranged for conduction in the opposite direction.

In FIG. 2, which illustrates only the drivers and the output pads of the module 10, the used drivers 18 are illustrated as receiving data input and delivering their output signals to the pads 24 which, in turn, delivers these signals off-chip, all in a conventional manner. On the other hand, the excess drivers 20 and their pads 24 (both shown in dotted outline in this figure) are coupled in two groups to the power terminals 32, 34.

Thus, a first half 42 of the excess drivers 20 and their pads 44 arc coupled across the power terminals 32, 34 for conduction in one direction, and a second half 46 and their pads 48 are coupled for conduction in the opposite direction. To accomplish the above, the first half 42 of excess drivers 20 are biased with Vdd in a manner to provide conduction from Gnd to their pads 44, which are connected to ground. Conversely, the pads 48 of the second half 46 of excess drivers 20, are connected to Vdd and the drivers biased to conduct to Gnd, in order to conduct to Vdd, as shown more clearly below with regard to FIG. 3.

For clarity, a portion of the driver circuits of chip 12 are illustrated in FIG. 3 with one of each of three different driver units, representative of the drivers 18, 42 and 46, being shown. A first driver unit 52 is representative of just one of the eight operational drivers or that is, used drivers 18, whereas a second driver unit 54 is representative of one of the four excess drivers 42, and a third driver unit 56 is representative of one of the four excess drivers 44.

As illustrated in this figure, the driver units 52, 54 and 56 each utilize the same basic CMOS fabrication, wherein each driver unit comprises a CMOS unit, designated 58, 60 and 62 for the driver units 52, 54 and 56 respectively. In regard to the above, it should be noted that the drivers often would be multi-stage units, and that only the output stages are illustrated in this figure.

Each of the CMOS units 58, 60 and 62 include a PFET transistor and a complementary NFET transistor connected in series in a push pull arrangement between Vdd and ground for producing the driver output. More particularly, CMOS 58 includes a PFET transistor 64 and a complementary NFET transistor 66, the CMOS 60 includes a PFET transistor 68 and a complementary NFET transistor 70, and finally, the CMOS 62 includes a PFET transistor 72 and a complementary NFET transistor 74.

These CMOS units 58, 60 and 62 are energized by means of the system voltage supply, in a conventional manner as shown. Each of the CMOS units 58, 60 and 62 have an input connector 76, 77 and 79 appropriately coupled to either the memory circuit 14 (in the case of the operational driver unit 52), or to one or the other of the power terminals for the excess driver units 54 and 56, as later explained in detail. In turn, each of the CMOS units also include an output conductor 78, shown in connection to their output pads 80, 82, and 84. respectively.

As previously noted, the driver unit 52 is operative in a conventional manner to provide an appropriate output in accordance with data input from the memory 14, shown in FIG. 1. Thus, the input connector 76 of driver unit 52 is configured to receive data signals and accordingly deliver them to its pad 80 for off chip transmission by means of an output connector 81, all in a well known manner On the other hand, the input 77 of the driver unit 54 is connected to Vdd (terminal 32) to render its PFET output transistor 68 conductive, and its pad is connected by a conductor 83 to ground (terminal 34) such that current will flow in a first direction from Vdd through transistor 68 to the pad 82 and to ground. Conversely, the input 79 of driver unit 56 is connected to ground to render its NFET transistor 74 conductive and its output pad 84 is connected by a conductor 85 to Vdd to provide a conductive path from pad 84 through transistor 74 to ground and thereby provide current flow in an opposite direction opposite to that of driver unit 54.

Consequently, it can be seen that module 10 has preferably one half 42 of its excess drivers 20 and their output pads 44 connected across the power terminals 32 and 34 in a manner configured to provide conduction in a first direction through at least portions of each of the one half of the excess drivers, and the other half 46, with their output pads 48, connected across the power terminals in a manner configured to provide conduction in the opposite direction.

To provide one half of the excess drivers conducting in a first direction and the other half conducting in an opposite direction, adjacent excess drivers could be alternately arranged to provide opposing power voltage paths. Various spacial arrangements of excess drivers having opposing paths can be realized to control impedance balance for select modules. In fact, the number of excess drivers utilized for conduction in either direction in any given module can also be arranged as desired for impedance balance. Hence, some or all of the excess drivers can be arranged as power paths conducting in a single direction.

Figure 4:
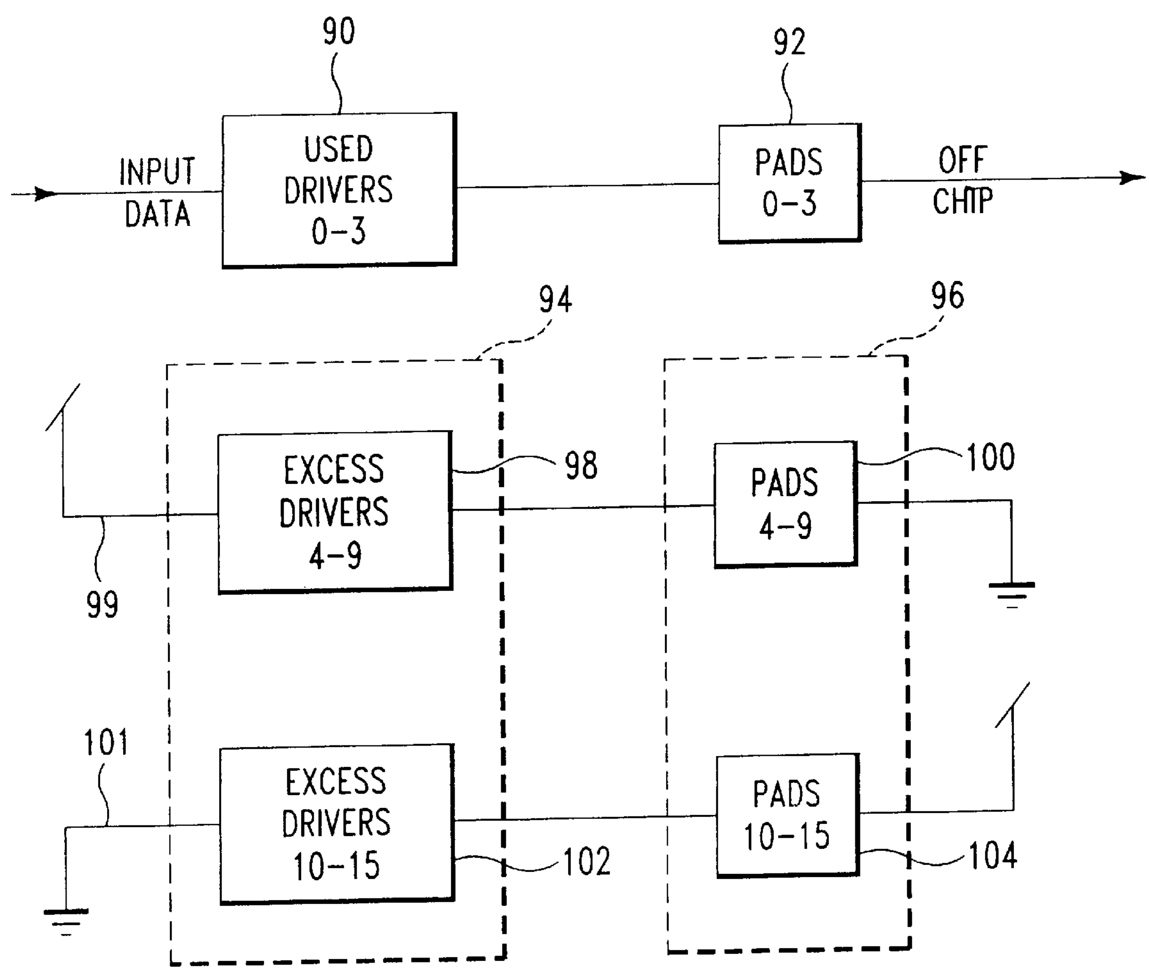
FIG. 4 is a block diagram illustrating a driver circuit arrangement in accordance with a second embodiment of the invention.

As illustrated in FIG. 4, wherein the driver arrangements of a second embodiment are shown, wherein the sixteen-bit chip is configured for utilization in a computer system requiring only for bits of memory. Hence, as shown in this figure, only four of the drivers 90 and their associated pads 92 are arranged to be used for off-chip driver operations and the remaining twelve drivers 94 and their pads 96 (shown in dotted outline) are excess.

In FIG. 4, the four used drivers 90 and their output pads 92 are utilized for delivery of data signals off chip, and in furtherance of that end, the pads 92 are respectively wired out to four module leads, not shown herein. In turn, the remaining twelve excess drivers 94 and their output pads 96 are utilized as additional power voltage paths.

That is, a first half 98 (six excess drivers) of drivers 94 and their six associated pads 100 are coupled between Vdd and ground in a manner to provide for conduction in a first direction, and a second half 102, and their pads 104 are coupled between Vdd and ground for conduction in the opposite direction. To accomplish the above, the input connector 99 of the first half 98 of the excess drivers 94 are biased in a manner to provide conduction from Vdd to the pads 100, which are connected to ground, whereas input connector 101 of the second half 102 of drivers 94 are coupled to ground and their pads 104 connected to Vdd.

In a manner similar to that of the first embodiment, the twelve excess drivers illustrated in FIG. 4 may be arranged as power paths in a variety of different arrangements to suit particular module considerations. Thus, some or all of the excess drivers may be utilized as impedance lowering, power paths, and may be varied in regard to the direction of current flow therethrough.

In the method of constructing the noted embodiments, the excess drivers and their output pads are preferably connected to the power terminals of the chip at the final wiring step in chip fabrication. Additionally, the wiring arrangements for the excess drivers could also be realized during other steps in manufacturing such as by a mask change.

This completes the description of the preferred embodiment of the invention.

Since changes may be made in the above construction without departing from the scope of the invention described herein, it is intended that all the matter contained in the above description or shown in the accompanying drawings shall be interpreted in an illustrative and not in a limiting sense. Thus other alternatives and modifications, will now become apparent to those skilled in the art without departing from the spirit and scope of the invention as set forth in the following claims.

What is claimed is:

1. A method for reducing the impedance of an integrated circuit module, the module comprising a chip of the type having a given circuit operative with a plurality of off-chip drivers, each driver having an output pad available for transmission of data signals off chip, and a pair of voltage power terminals for facilitating energization of the chip circuits, the module being constructed for operation of its given circuit in a manner utilizing less than the number of available drivers such that the module includes a first number of drivers and their output pads arranged for use with the given circuit and a second number of excess drivers and their associated output pads which are excess for operation of the given circuit, the method comprising the steps of:

connecting said first number of drivers to said power terminals for operation in accordance with data input from said given circuit and the output pads of said first number of drivers to external leads of said module to facilitate delivery of data signals therefrom; and connecting at least one of said excess drivers and its pad across said power terminals in a manner to provide conduction through at least a portion of said one excess driver so as to provide at least one additional power path in parallel with the power voltage paths through said first number of drivers to thereby reduce module impedance.

2. The method of claim 1 wherein said step of connecting said at least one of said excess drivers and its pad to said power terminals is completed at the final wiring step in the fabrication of said chip.

3. The method of claim 1 wherein said step of connecting at least one of said excess drivers and its output pad to the pair of power terminals for conduction includes connecting at least a first of said excess drivers to one of said power terminals and its pad to the other of said power terminals in a manner to render at least potions of said first driver conductive, and connecting at least a second of said excess drivers to the other of said power terminals and its pad to said one said power terminals in a manner to render at least potions of said second driver conductive so as to provide at least a pair of conductive power paths in parallel with existing power paths in said module.

4. The method of claim 1 wherein said step of connecting at least one of said excess drivers and its output pad to the pair of power terminals for conduction includes connecting a first number of said excess drivers to the high side of said power terminals and their associated pads to the low side thereof, and connecting a second number of said excess drivers to the low side of said power terminals and their associated pads to the high side thereof.

5. The method of claim of claim 1 wherein said given circuit is a memory circuit and said step of connecting at least one of said excess drivers and its associated output pad between the pair of power terminals for conduction includes connecting a first group of said excess drivers to the high side of said power terminals and their associated pads to the low side thereof, and connecting a second group of said excess drivers to the low side of said power terminals and their associated pads to the high side thereof.

6. The method of claim 5 wherein said step of connecting said first and second groups of drivers and their pads for conduction includes connecting at least portions of a first half of said excess pads and of their associated drivers to said pair of power terminals to provide conduction in a first direction through said first half of said excess drivers, and connecting at least portions of a second half of said excess output pads and their associated drivers to said pair of power terminals to provide conduction in a direction opposite to said first direction through said second half of said excess drivers.

7. An integrated semiconductor module of reduced impedance utilizing a chip having a given circuit, a plurality of off-chip drivers and their associated output pads for facilitating transmission of signals from said given circuit, and a pair of voltage power terminals for facilitating energization of the chip circuits, the module being constructed with a chip architecture of the type configured for operation with less than the number of available drivers such that there are a number of excess drivers and their associated output pads which are in excess of those needed for driver operations, and at least one of said excess drivers and its output pad are connected to the power terminals of the chip to render at least portions of said one driver conductive thereby providing at least one additional power path in parallel with the power paths of the operational drivers so as to reduce module impedance.

8. The module of claim 7 wherein at least one of said excess drivers is connected to the high side of said power terminals and its associated output pad connected to the low side thereof to render at least portions of said one driver conductive and another of said excess drivers is connected to the low side of said power terminals and its associated output pad connected to the high side thereof to render at least portions of said another driver conductive.

9. The module of claim 8 wherein approximately one half of said excess drivers and their output pads are connected across said power terminals to provide conduction in a first direction through at least portions of said approximately one half of said excess drivers, and approximately the other half of said excess drivers and their output pads are connected across said power terminals to provide conduction in the opposite direction through said approximate other one half of said excess drivers.

10. The module of claim 8 wherein said given circuit is a memory circuit and a first group of said excess drivers are connected to the high side of said power terminals and their associated pads to the low side thereof, and a second group of said excess drivers are connected to the low side of said power terminals and their associated pads to the high side thereof.

11. The module of claim 10 wherein said first group is approximately one half of said excess drivers coupled to the high side of said power terminals and their associated output pads to the low side thereof and said second group is approximately an other half of said excess drivers coupled to said low side of said power terminals and their associated output pads to the high side thereof.

12. The module of claim 10 wherein said given chip architecture is designed for a sixteen bit module and said module is configured for utilization of only eight bits such that eight off-chip drivers and their associated output pads are in excess of those necessary for the eight bits of operational memory, and four of said excess drivers are coupled to the high side of said power terminals and their associated pads to the low side thereof, and the remaining four of said excess drivers are coupled to said low side of said power terminals and their associated pads to the high side thereof.

13. The module of claim 10 wherein said chip architecture is designed for a sixteen bit module with said module is configured for utilization of only four bits such that twelve off-chip drivers and their associated output pads are in excess of those necessary for the four bits of operational memory, and six of said excess drivers are coupled to the high side of said power terminals and their associated output pads to the low side thereof, and the remaining six of said excess drivers are coupled to said low side of said power terminals and their associated output pads to the high side thereof.

* * * * *